United States Patent [19]

Gollinger

[11] 3,979,698

[45] Sept. 7, 1976

[54] CRYSTAL OSCILLATOR CIRCUIT

[75] Inventor: Wolfgang Gollinger, Gundelfingen, Germany

[73] Assignee: ITT Industries, Inc., New York, N.Y.

[22] Filed: Sept. 8, 1975

[21] Appl. No.: 611,051

Related U.S. Application Data

[63] Continuation of Ser. No. 510,928, Oct. 1, 1974, abandoned.

[30] Foreign Application Priority Data

Oct. 19, 1973  Germany............................ 2352421

[52] U.S. Cl. ............................ 331/116 R; 58/23 A; 58/23 AC
[51] Int. Cl.² ......................................... H03B 5/36
[58] Field of Search ............ 331/116, 108; 307/304; 58/23

[56] References Cited
UNITED STATES PATENTS 3,702,943  11/1972  Heuner et al. ..................... 307/304
3,725,822  4/1973  Eaton, Jr. ........................... 331/116
3,855,549  12/1974  Heuner et al. ................... 331/108 D Primary Examiner—John Kominski
Attorney, Agent, or Firm—John T. O'Halloran; Alfred C. Hill

[57] ABSTRACT

A known crystal oscillator circuit is modified to improve the starting of oscillations therein when a low supply voltage is employed. The oscillator circuit includes two complementary field effect transistors connected in a known manner to each other and a frequency determining circuit including a crystal. The modification includes a first additional field effect transistor having its drain-source path connected in parallel with the drain-source path of one of the oscillator field effect transistors or a second additional field effect transistor having its drain-source path connected in parallel with the drain-source path of the other of the oscillators field effect transistors. The first and second additional field effect transistors are of the same conductivity type as the oscillator field effect transistor it is in parallel with.

4 Claims, 2 Drawing Figures

CRYSTAL OSCILLATOR CIRCUIT

CROSS REFERENCE TO RELATED APPLICATIONS

This is a continuation of application Ser. No. 510,928, filed Oct. 1, 1974, and now abandoned.

BACKGROUND OF THE INVENTION

This invention relates to a semiconductor crystal oscillator circuit and more particularly to such an oscillator circuit employed in an integrated circuit electronic watch.

The present invention deals with a problem which is encountered in crystal oscillator circuits, particularly quartz crystal oscillator circuits, which have an inverter stage using complementary insulated field-effect transistor technology. This technology is also referred to as "C-MOS technology", with "C-MOS" being an abbreviation for "Complementary Metal Oxide Semiconductor". As a result of the technological development, instead of the oxide, other insulated-gate materials have also come into common use for the channel region so that "C-MOS" no longer involves a limitation to oxides employed as insulated-gate materials.

The aforementioned inverter stage consists of a p-channel transistor and an n-channel transistor which have their series-connected drain-source paths connected between ground and the ungrounded terminal of the supply-voltage source and whose gate electrodes are connected together and, via the crystal having a resistor shunted thereacross, to the common drain-drain node of the two complementary transistors. The two crystal electrodes are also each connected either to ground or to the ungrounded terminal of the supply-voltage source via one capacitor. These two capacitors, just as the crystal, are part of the oscillator's feedback network.

Such crystal oscillator circuits are disclosed in German Published Application (DT-OS) 2,153,828. The problem underlying the invention is that the sum of the values of the gate threshold voltages of the two transistors limits the minimum supply voltage in such a manner that at supply voltages below the sum of the values of the gate threshold voltages the oscillator circuit does not start. This disadvantage is particularly disturbing in the case of low supply voltages, e.g. in the 1-V (volt) range.

SUMMARY OF THE INVENTION

It is therefore an object of the present invention to improve the starting behaviour of the aforementioned crystal oscillator circuit at low supply voltages.

A feature of the present invention is the provision of a crystal oscillator circuit comprising: a supply voltage source having a ground terminal and a voltage supply terminal; a p-channel insulated-gate field effect transistor having a source electrode, a drain electrode, a gate electrode and a substrate terminal; a n-channel insulated-gate field effect transistor having a source electrode, a drain electrode, a gate electrode and a substrate terminal; the p-channel and the n-channel transistors having their drain electrode source electrode paths coupled in series with each other and between the ground terminal and the voltage supply terminal; first means to connect the gate electrodes of the p-channel and the n-channel transistors together; second means to connect the substrate terminal of the p-channel transistor to the voltage supply terminal; third means to connect the substrate terminal of the n-channel transistor to the ground terminal; a crystal having two terminals, one of the two terminals being coupled to the first means and the other of the two terminals being coupled to the drain electrode junction of the series connected drain electrode-source electrode paths; a resistor coupled in parallel with the crystal; a first capacitor connected between one of the two terminals and the ground terminal; a second capacitor connected between the other of the two terminals and the ground terminal; and an additional insulated-gate field effect transistor having a source electrode, a drain electrode, a gate electrode and substrate terminal; the additional transistor having its drain electrode-source electrode path coupled in parallel with the drain electrode-source electrode path of one of the p-channel and the n-channel transistors; the additional transistor being of the same channel type as the one of the p-channel and the n-channel transistors having its gate electrode coupled to the appropriate one of the voltage supply and ground terminals and its substrate terminal coupled identical to the one of the p-channels and the n-channel transistors.

BRIEF DESCRIPTION OF THE DRAWING

Above-mentioned and other features and objects of this invention will become more apparent by reference to the following description taken in conjunction with the accompanying drawing, in which.

DESCRIPTION OF THE PREFERRED EMBODIMENTS

Figure 1:
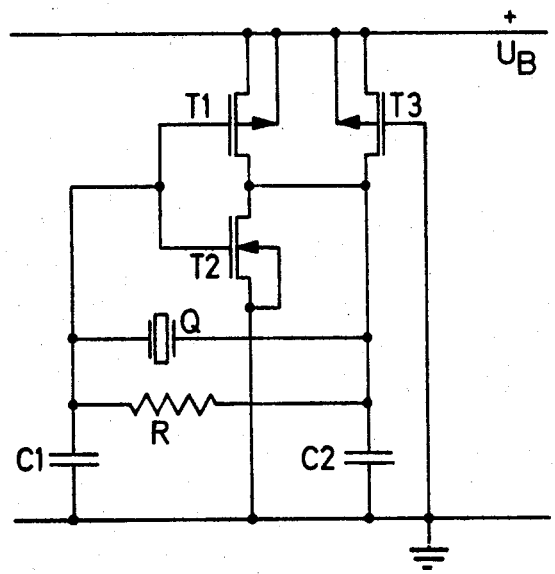
FIG. 1 is a schematic diagram of the above-mentioned known crystal oscillator circuit incorporating one modification thereof in accordance with the principles of the present invention.
Figure 2:
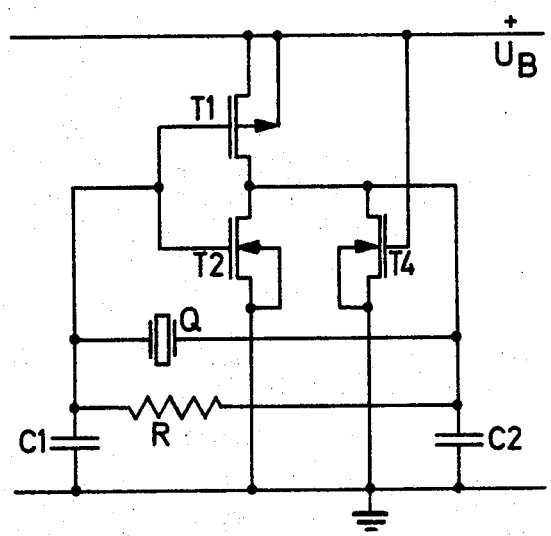
FIG. 2 is a schematic diagram of the above-mentioned known crystal oscillator circuit incorporating another modification thereof in accordance with the principles of the present invention.

FIGS. 1 and 2 each illustrate the above-mentioned known crystal oscillator circuit including two complementary insulated-gate field-effect transistors T1 and T2, which have their series-connected source-drain paths connected between ground and the ungrounded terminal + of the supply-voltage source $U_B$ to form an inverter stage, as stated above. Transistor T1 is a p-channel transistor and transistor T2 an n-channel transistor. Thus, in the series arrangement, the source electrode of the p-channel transistor T1 is connected to the ungrounded terminal + of the supply-voltage source $U_B$, while the source-electrode of the n-channel transistor T2 is grounded. The substrate terminals of the two transistors are at the appropriate potential as usual, i.e. that of the p-channel transistor is connected to the ungrounded terminal of the supply-voltage source, and that of the n-channel transistor to ground.

The interconnected gate electrodes of transistors T1 and T2 are connected via the crystal Q and the resistor R, connected in parallel with the crystal, to the common junction point of the source-drain paths of transistors T1 and T2, i.e. to the junction point of the latters' two drain electrodes. Furthermore, the two crystal terminals are connected via the capacitors C1 and C2 to ground.

According to FIG. 1, the first modification for attaining the object of the invention includes connecting the drain-source path of an additional p-channel transistor T3 in parallel with the drain-source path of the p-channel transitor T1 and grounding the gate electrode of the p-channel transistor T3.

FIG. 2 shows the second modification for attaining the object of the invention including shunting the source-drain path of an additional n-channel transistor T4 across the source-drain path of the n-channel transistor T2 and connecting the gate electrode of the n-channel transistor T4 to the ungrounded terminal + of the supply-voltage source $U_B$.

In both modifications, the substrate terminal of the respective additional transistor is connected in the same manner as the associated transistor of the same conductivity type.

Especially good characteristics of the circuit according to the invention can be achieved if the conductivity of the respective additional transistor in the "on" state is considerably lower than that of the respective parallel-connected transistor.

Through the invention, the starting condition is satisfied even at supply voltages below the sum of the values of the gate threshold voltages. Thus, the oscillator circuit starts oscillating or oscillates if the supply voltage $U_B$ is higher than one of the values of the gate threshold voltages of the complementary transistors.

The crystal may be quartz or another piezoelectric crystal or ceramic material. Also, the geometrical shape of the crystal is not limited to a rectangular section, but the crystal may be of any shape. It is also possible to use tuning-fork-shaped crystals.

The crystal oscillator circuit according to the invention is applicable whenever frequencies stabilized by means of crystals must be used at low supply voltages, particularly in the 1-V range, i.e., for instance, in crystal controlled clocks, in ultrasonic remote controls with a crystal oscillator as the reference frequency generator, or in crystal oscillators for voice frequency dialling in telephone systems.

The circuit of the invention can be monolithically integrated without difficulty, thus forming part of a large integrated circuit. The additional transistor T3 or T4 may also be replaced by an ohmic resistance to be inserted between the common drain junction point of the transistors T1 and T2 and ground or the ungrounded terminal + of the supply-voltage source $U_B$.

While I have described above the principles of my invention in connection with specific apparatus it is to be clearly understood that this description is made only by way of example and not as a limitation to the scope of my invention as set forth in the objects thereof and in the accompanying claims.

I claim:

1. A crystal oscillator circuit comprising:
   a supply voltage source having a ground terminal and a voltage supply terminal;
   a p-channel insulated-gate field effect transistor having a source electrode, a drain electrode, a gate electrode and a substrate terminal;
   a n-channel insulated-gate field effect transistor having a source electrode, a drain electrode, a gate electrode and a substrate terminal;
   said p-channel and said n-channel transistors having their drain electrode-source electrode paths directly coupled in series with each other and between said ground terminal and said voltage supply terminal;
   first means to connect said gate electrodes of said p-channel and said n-channel transistors together;
   second means to connect said substrate terminal of said p-channel transistor to said voltage supply terminal;
   third means to connect said substrate terminal of said n-channel transistor to said ground terminal;
   a crystal having two terminals, one of said two terminals being coupled to said first means and the other of said two terminals being coupled to said drain electrode junction of said series connected drain electrode-source electrode paths;
   a resistor coupled in parallel with said crystal;
   a first capacitor connected between said one of said two terminals and said ground terminal;
   a second capacitor connected between the other of said two terminals and said ground terminal; and
   one additional insulated-gate field effect transistor having a source electrode, a drain electrode, a gate electrode and substrate terminal;
   said additional transistor having its drain electrode-source electrode path directly coupled in parallel with said drain electrode-source electrode path of one of said p-channel and said n-channel transistors;
   said additional transistor being of the same channel type as said one of said p-channel and said n-channel transistors having its gate electrode coupled to the appropriate one of said voltage supply and ground terminals and its substrate terminal coupled identical to said one of said p-channel and said n-channel transistors.

2. A circuit according to claim 1, wherein
said additional transistor is a p-channel transistor,
said one of said p-channel and said n-channel transistor is said p-channel transistor, and
said gate electrode of said additional transistor is coupled to said ground terminal.

3. A circuit according to claim 1, wherein
said additional transistor is a n-channel transistor,
said one of said p-channel and said n-channel transistor is said n-channel transistor, and
said gate electrode of said additional transistor is coupled to said voltage supply terminal.

4. A circuit according to claim 1, wherein
said additional transistor has a conductivity in its "on" state that is considerably lower than the conductivity of said one of said p-channel and said n-channel transistors.

* * * * *